(12) United States Patent
Wang

(10) Patent No.: US 6,174,813 B1
(45) Date of Patent: Jan. 16, 2001

(54) DUAL DAMASCENE MANUFACTURING PROCESS

(75) Inventor: Kuang-Chih Wang, Taichung Hsien (TW)

(73) Assignee: United Integrated Circuits Corp., Hsinchu (TW)

( * ) Notice: Under 35 U.S.C. 154(b), the term of this patent shall be extended for 0 days.

(21) Appl. No.: 09/173,084

(22) Filed: Oct. 14, 1998

(30) Foreign Application Priority Data

Jul. 22, 1998 (TW) ................................................ 87111936

(51) Int. Cl.[7] .......................... H01L 21/302; H01L 21/461
(52) U.S. Cl. ............................................. 438/692; 438/695
(58) Field of Search .................................. 438/700, 701, 438/706, 691, 692, 693, 723, 720

(56) References Cited

U.S. PATENT DOCUMENTS

| | | | |
|---|---|---|---|
| 5,484,747 | * | 1/1996 | Chien ................................. 438/700 |
| 5,651,855 | * | 7/1997 | Denninson et al. .............. 156/636.1 |
| 5,741,741 | * | 4/1998 | Tseng .................................. 438/700 |
| 5,770,095 | * | 6/1998 | Sasaki et al. ....................... 438/692 |
| 5,804,513 | * | 9/1998 | Sakatani et al. ................... 438/693 |

* cited by examiner

Primary Examiner—Benjamin L. Utech
Assistant Examiner—Duy-Vu Deo
(74) Attorney, Agent, or Firm—Jiawei Huang; J. C. Patents

(57) ABSTRACT

A dual damascene process of manufacturing dual damascene structure comprising the steps of first providing a semiconductor substrate that already has an insulating layer formed thereon. Next, a trench and a via opening are formed within the insulating layer. In the subsequent step, a first glue layer, preferably a titanium layer, is formed over the trench and the via opening. Thereafter, photolithographic and etching operations are again used to remove a portion of the first glue layer in a region surrounding the trench. Consequently, a portion of the insulating layer is exposed while the trench and the via opening are still covered by the first glue layer. After that, a second glue layer, preferably a titanium nitride layer, is formed over the first glue layer and the insulating layer. Then, a metallic layer is formed over the second glue layer. The metallic layer completely fills the trench and the via opening. The second glue layer and the metallic layer have a polishing selectivity ratio of about 1:1. Finally, a polishing operation is performed to remove a portion of the metallic layer and second glue layer above the insulating layer.

20 Claims, 4 Drawing Sheets

DUAL DAMASCENE MANUFACTURING PROCESS

CROSS-REFERENCE TO RELATED APPLICATION

This application claims the priority benefit of Taiwan application serial no. 87111936, filed Jul. 22, 1998, the full disclosure of which is incorporated herein by reference.

BACKGROUND OF THE INVENTION

1. Field of Invention

The present invention relates to a method of manufacturing metal interconnects. More particularly, the present invention relates to a dual damascene manufacturing process that uses a tungsten chemical-mechanical polishing (W-CMP) operation.

2. Description of Related Art

In the manufacturing process of very large scale integration (VLSI) circuits, semiconductor devices are linked by two or more metallic interconnects commonly known as multilevel interconnects. The purpose of having multilevel interconnects is to establish a three-dimensional wiring structure so that devices can be interconnects even when device density continues to increase. Normally, a first metallic wiring layer is formed over a substrate. The first layer can be a polysilicon or a metallic layer and the first layer is electrically connected to one of the source/drain regions of a device embedded in the substrate. For the interconnection of additional devices, a second or more layers can be subsequently formed on top of the first layer. However, as the level of integration continues to increase, capacitance effect of the metallic wires will also increase correspondingly. Consequently, RC delay and cross talk between vias will tend to intensify and the speed of transmission by the metallic wires will be slower.

At present, a new method of manufacturing metal interconnects known as a dual damascene process has been developed. Using the dual damascene process, high-quality metal interconnect structures can be manufactured. One major characteristic of the dual damascene process is the simultaneous etching of metallic wire pattern and via structures. The dual damascene process includes the steps of first depositing an insulating layer such as a silicon dioxide layer over a semiconductor substrate. Then, photolithographic and anisotropic etching operations are conducted to form a trench in the insulating layer. The trench is formed in location where the metallic wire pattern is desired. In addition, the trench is formed such that depth of the trench is not deep enough to penetrate the insulating layer. Next, another set of photolithographic and etching operations are conducted to form a via opening in the insulating layer such that a portion of the semiconductor substrate is exposed.

Generally, the width of a via opening is smaller than the width of the trench above. Thereafter, metal such as tungsten is deposited to fill the trench and the via opening. Subsequently, a chemical-mechanical polishing (CMP) operation is carried out to remove a portion of the metallic layer above the trench surface, thereby forming a metallic wire pattern electrically linked to other devices or another wire pattern below through a via.

FIG. 1 is a cross-sectional view showing a conventional dual damascene structure. In FIG. 1, an insulating layer 12 made from material such as silicon dioxide is formed above a semiconductor substrate 10. Within the insulating layer 12, a metallic wiring layer 16b is formed above a via 16a, both of which are made from tungsten. In addition, a glue layer is formed between the metal wiring layer 16b and the insulating layer 12 as well as between the via 16a and the insulating layer 12. The glue layer 14 is normally a titanium/titanium nitride (Ti/TiN) composite layer or a layer made from other refractory metals. The purpose of forming the glue layer 14 is to increase adhesion between the metallic wiring layer 16b and the insulating layer 12.

However, using the aforementioned dual damascene process often results in dishing on the surface of the metallic wiring layer. This is because the excess tungsten above the metallic wiring layer 16b is normally removed by a chemical-mechanical polishing method. A difference in polishing selectivity will generate a non-planar or a dish surface 19 as shown in FIG. 1. Using a Ti/TiN glue layer as an example, polishing selectivity between tungsten (W) and titanium (Ti) is roughly 3:1~5:1.

However, the polishing selectivity between tungsten (W) and titanium nitride (TiN) is about 1:1. Due to a difference in polishing rate between titanium and tungsten when the titanium layer is polished, a dish surface 19 will form on the surface of the metallic wiring layer 16b. The dish surface 19 can compromise the resulting quality of subsequently deposited layers. In serious cases, oxide erosion or the so-called volcano effect may occur. Moreover, a portion of the residual refractory metal will remain on top of the glue layer 14 after polishing. Therefore, unwanted bridges that may lead to short-circuiting can be produced.

Conventionally, the only remedy for rectifying the dishing effect is to perform multiple polishings with different slurries and polishing pads so that the problem of high polishing selectivity can be reduced. However, multiple polishing will lead to an increase in the amount of rework, thereby raising the production cost.

In light of the foregoing, there is a need to provide an improve method of forming a dual damascene structure.

SUMMARY OF THE INVENTION

Accordingly, the present invention provides a dual damascene manufacturing process capable of reducing the frequency of rework due to a high polishing selectivity between tungsten and a refractory metal. Thus, the invention is capable of preventing the dishing effect and eliminating oxide erosion.

To achieve these and other advantages and in accordance with the purpose of the invention, as embodied and broadly described herein, the invention provides a dual damascene manufacturing process. The process comprises the steps of first providing a semiconductor substrate, and then forming an insulating layer such as silicon dioxide layer over the substrate. Next, a trench and then a via opening are formed within the insulating layer such that the via opening is located underneath the trench. The trench can be formed by photolithographic and anisotropic etching operations. Depth of the trench is controlled by the etching time or and point. The via opening is also formed by performing photolithographic and anisotropic etching operations. In the subsequent step, a first glue layer is formed over the trench and the via opening. The first glue layer can be a titanium/titanium nitride (Ti/TiN) composite layer, a titanium layer, or other layer made from a refractory metal. Thereafter, photolithographic and etching operations are again carried out to remove a portion of the first glue layer in a region surrounding the trench. Consequently, a portion of the insulating layer is exposed while the trench and the via opening are still covered by the first glue layer. After that, second glue layer is formed over the first glue layer and the insulating layer. The second glue layer can be a titanium nitride (TiN) layer or a layer made from other refractory metal. Then, a metallic layer is formed over the second glue layer. The metallic layer can be a tungsten layer or a copper layer, and the metallic layer completely fills the trench and the via opening. The second glue layer and the metallic layer have a polishing selectivity ratio of about 1:1. Finally, a polishing operation is performed to remove a portion of the metallic layer and second glue layer above the insulating layer, thereby forming a metallic wiring layer and a via in the via opening. Polishing can be performed by using a chemical-mechanical polishing method such that the slurry has the same polishing rate for both the metallic layer and the second glue layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
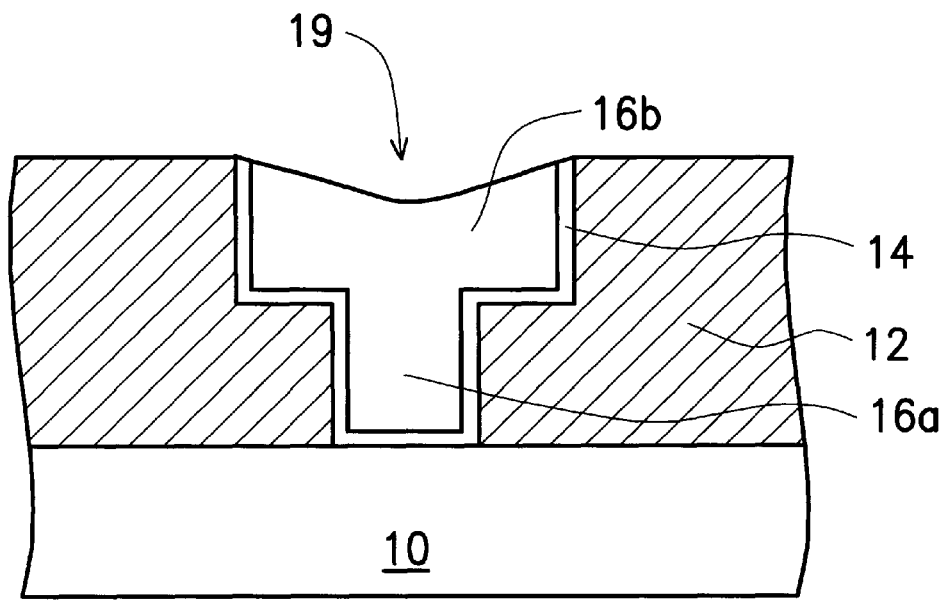
FIG. 1 is a schematic, cross-sectional view showing a conventional dual damascene structure.

Reference will now be made in detail to the present preferred embodiments of the invention, examples of which are illustrated in the accompanying drawings. Wherever possible, the same reference numbers are used in the drawings and the description to refer to the same or like parts.

The present invention provides a dual damascene manufacturing process capable of reducing the frequency of rework due to a high polishing selectivity between tungsten and a refractory metal, and furthermore capable of preventing dishing effect and eliminating oxide erosion.

Figure 2A:
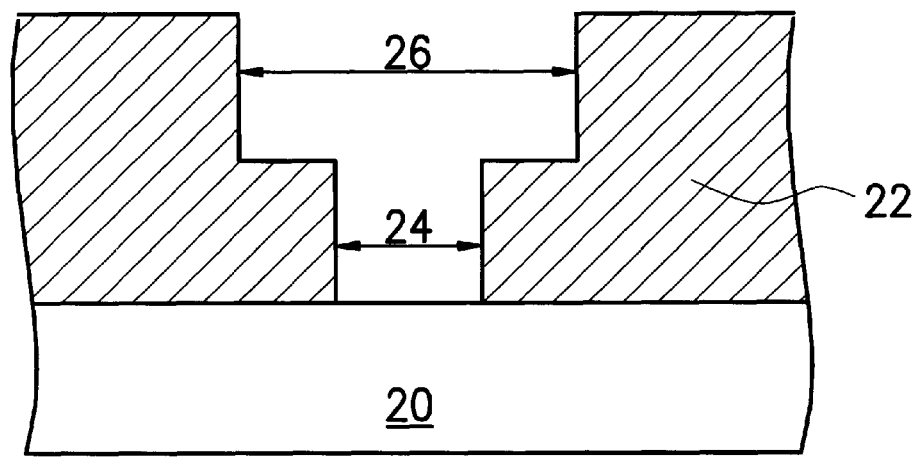
FIGS. 2A 2B, 2C, 2D, 2E, 2F and 2G are schematic, cross-sectional views showing the progression of manufacturing steps in producing a dual damascene structure according to one preferred embodiment of this invention.

FIGS. 2A through 2G are schematic, cross-sectional views showing the progression of manufacturing steps in producing a dual damascene structure according to one preferred embodiment of this invention. First, as shown in FIG. 2A, a semiconductor substrate 20 is provided. The substrate 20 has first wiring layer or transistor structure (not shown in the Fig.) already formed therein. Thereafter, an insulating layer 22 is formed over the semiconductor substrate 20. The insulating layer 22, for example, can be a silicon oxide ($SiO_2$) layer. Preferably, the insulating layer 22 has a thickness of about 7000 Å to 10000 Å formed by a chemical vapor deposition (CVD) method. Normally, the surface of the insulating layer 22 is planarized using, for example, an etching back method or a chemical-mechanical polishing (CMP) method.

In the subsequent step, a trench 26 and then a via opening 24 are formed within the insulating layer 22. The trench has a width slightly larger than the via opening 24. In general, the trench 26 is formed using photolithographic and anisotropic etching operations, wherein the depth of etching is adjusted by controlling etching time or forming an etching end point. Depth of the trench 26 preferably should correspond to the thickness of the ultimate metal wiring layer. The via opening 24 is again formed using, for example, photolithographic and anisotropic etching operations.

Figure 2B:
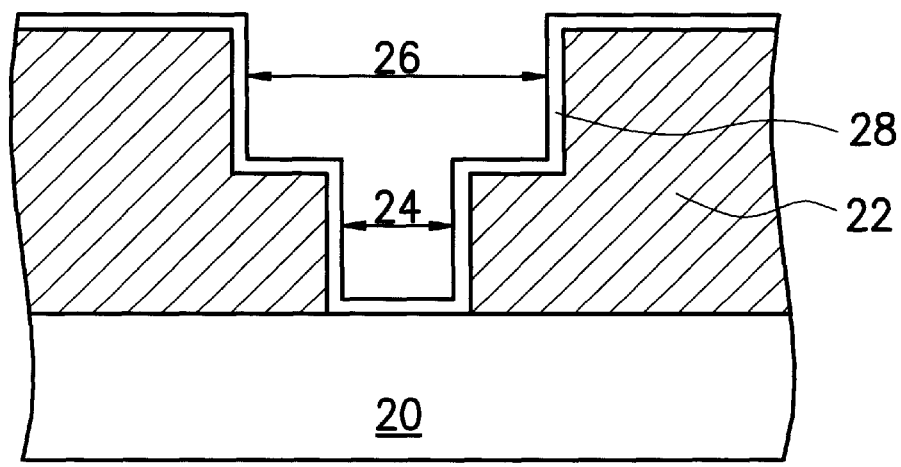

Next, as shown in FIG. 2B, a thin first glue layer 28 is formed over the insulating layer 22 and the interior surfaces of the trench 26 and the via opening 24. The first glue layer 28 can be a titanium/titanium nitride (Ti/TiN) composite layer, a titanium (Ti) layer or other layers made from refractory metals using, for example, a chemical vapor deposition (CVD) method. The first glue layer 28 preferably has a thickness of about 300 Å to 500 Å.

Figure 2C:
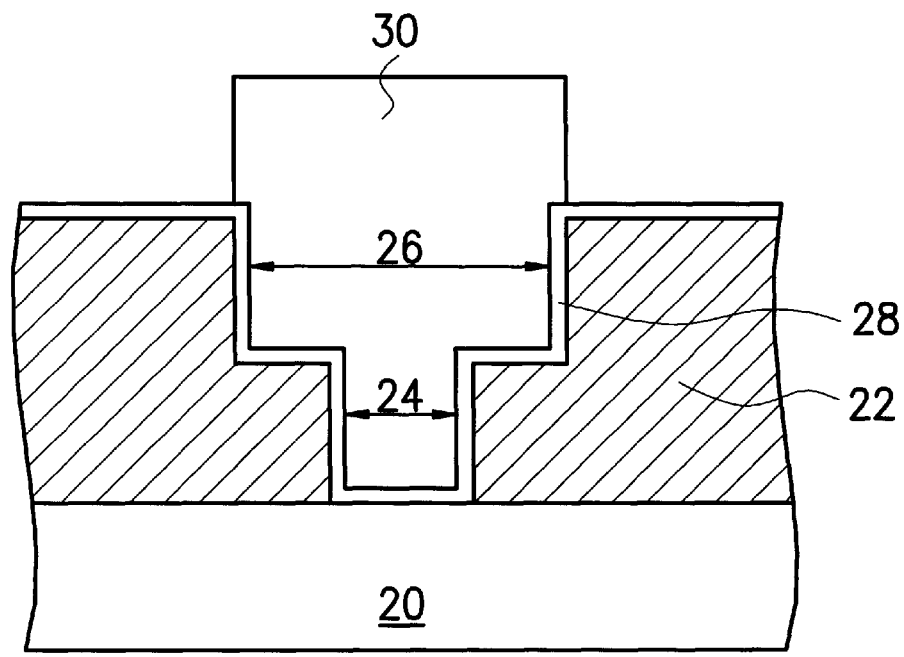

Next, as shown in FIG. 2C, a photoresist layer is formed over the first glue layer 28. Then, photolithographic and etching operations are carried out to form a patterned photoresist layer 30 that exposes the first glue layer 28 in regions surrounding the trench 26. Thereafter, using the patterned photoresist layer 30 as a mask, an anisotropic etching operation is conducted to remove the glue layer 28 surrounding the trench 26 region, thereby exposing the insulating layer 22 below. Etching of the first glue layer 28 is one major aspect in this invention. Subsequently deposited titanium nitride (TiN) layer and tungsten (W) layer have a polishing selectivity ratio of about 1:1. Hence, the polishing operation will be free from processing problems as long as the first glue layer 28 on the top surface of the insulating layer 22 surrounding the trench 26 is first removed.

Figure 2D:
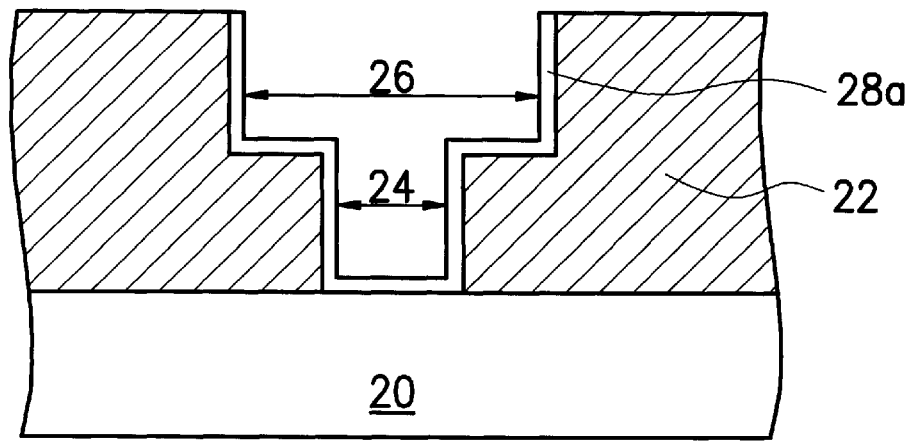

Next, as shown in FIG. 2D, the photoresist layer 30 is removed using oxygen-containing plasma or removed chemically using an acid. Finally, a portion of the first glue layer 28a remains over the interior surface of the trench 26 and the via opening 24.

Figure 2E:
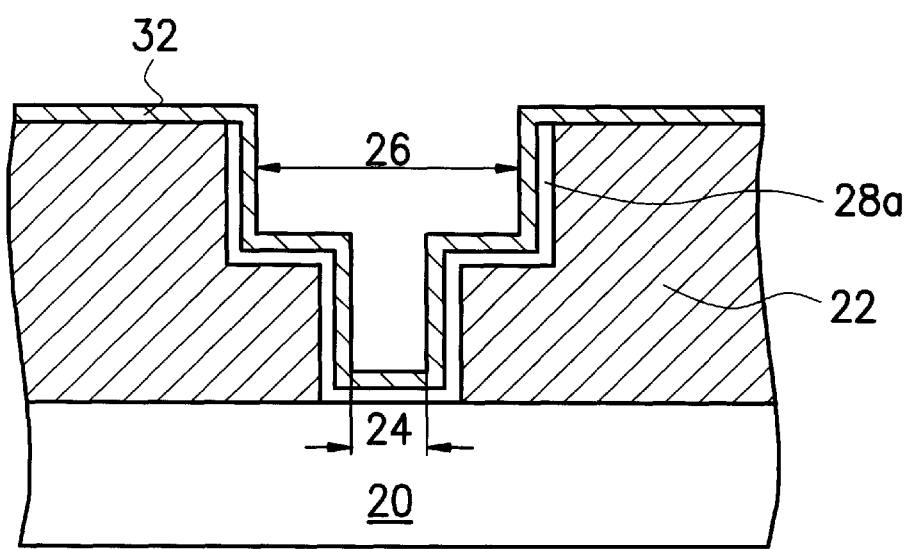

Next, a second glue layer 32 is formed over the first glue layer 28 and the insulating layer 22 as shown in FIG. 2E. The second glue layer 32, preferably having a thickness of about 300 Å to 500 Å, can be a titanium nitride (TiN) layer or other layers made from refractory metals formed using, for example, a chemical vapor deposition (CVD) method. The second glue layer serves to boost the adhesive strength between a subsequently deposited metallic layer and silicon dioxide layer as well as to prevent the volcano effect.

Figure 2F:
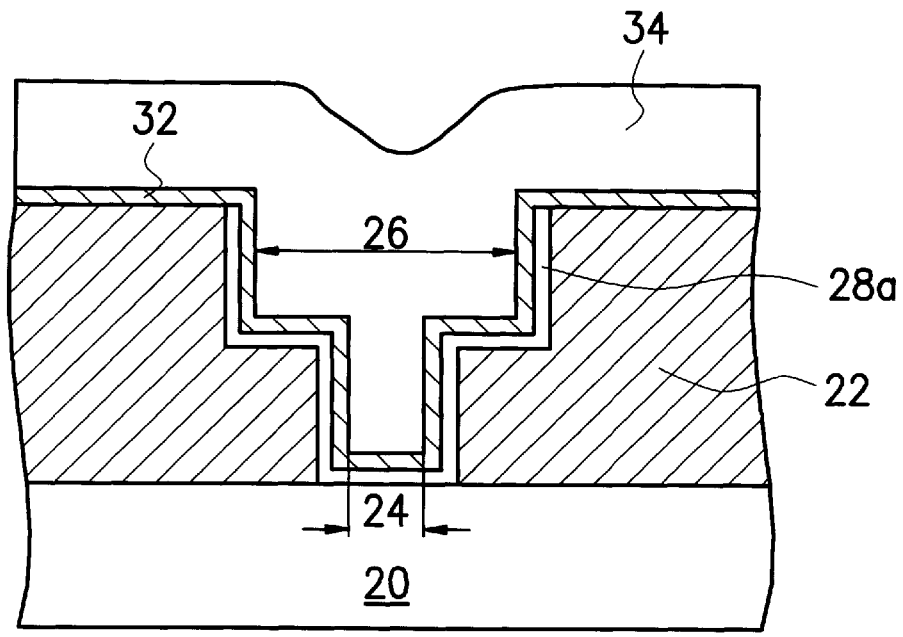

Next, as shown in FIG. 2F, metal is deposited over the second glue layer 32 and forms a metallic layer 34 that completely fills the trench 26 and the via opening 24. The metallic layer 34, for example, can be a tungsten layer or a copper layer formed using a chemical vapor deposition (CVD) method. Alternatively, the metallic layer 34 can be formed using a physical vapor deposition (PVD) method such as sputtering. If the metallic layer 34 is a copper layer, the copper layer can be formed using an electrochemical deposition (ECD) process.

Figure 2G:
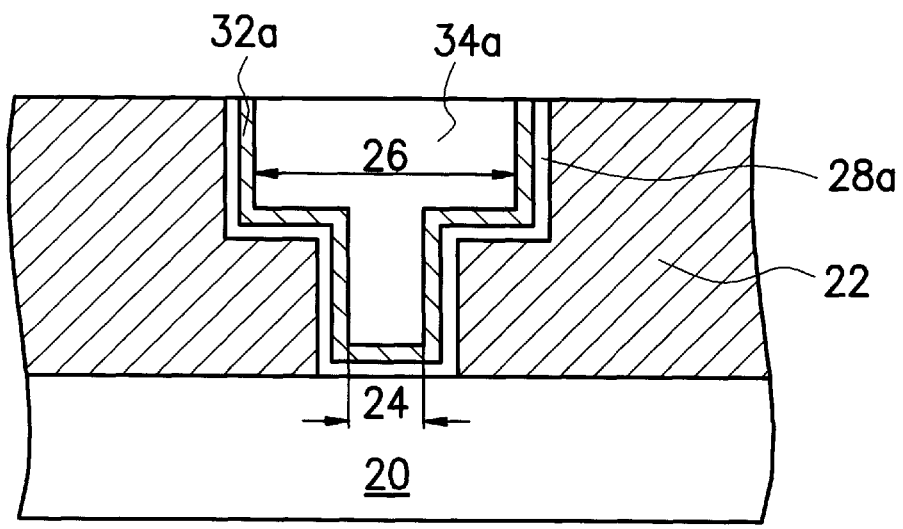

Next, as shown in FIG. 2G, a polishing operation, for example, a chemical-mechanical polishing operation, is conducted to remove excess metal and a portion of the second glue layer 32 above the insulating layer 22 surface. Ultimately, a metallic wiring layer 34a is formed, thereby forming a complete dual damascene structure. The metallic wiring layer 34a is electrically connected to devices embedded within the substrate 20 through the via 24.

In summary, major aspects of this dual damascene manufacturing process include:

1. Frequency of rework can be lowered. In other words, problems caused by a high polishing selectivity ratio between a tungsten layer and a refractory metal layer are mostly eliminated.

2. Besides being capable of preventing dishing in the upper surface of a metallic layer, this invention is also capable of eliminating oxide erosion.

It will be apparent to those skilled in the art that various modifications and variations can be made to the structure of the present invention without departing from the scope or spirit of the invention. In view of the foregoing, it is intended that the present invention cover modifications and variations to this invention provided they fall within the scope of the following claims and their equivalents.

What is claimed is:

1. A dual damascene manufacturing process, comprising the steps of:

providing a semiconductor substrate;

forming an insulating layer over the semiconductor substrate;

forming a trench and a via opening within the insulating layer, wherein the via opening is located below the trench;

forming a first glue layer over the surface of the trench and the via opening;

after forming the first glue layer, performing photolithographic and etching operations to remove a portion of the first glue layer surrounding the trench region so that the insulating layer is exposed while the trench and the via opening are still covered by the first glue layer;

after the first glue layer being etched, forming a second glue layer upon the remaining first glue layer and the exposed insulating layer;

forming a metallic layer over the second glue layer so that the trench and the via opening are completely filled, wherein the second glue layer and the metallic layer have a polishing selectivity ratio of about 1:1; and performing a polishing operation to remove a portion of the metallic layer and second glue layer above the surface of the insulating layer uncovered by the first glue layer so that a metallic wiring layer is formed inside the trench and a via is formed inside the via opening.

2. The process of claim 1, wherein the step of forming the insulating layer includes depositing silicon dioxide.

3. The process of claim 1, wherein the step of forming the via opening includes performing photolithographic and anisotropic etching operations.

4. The process of claim 1, wherein the step of forming the first glue layer includes depositing titanium and then titanium nitride to form a titanium/titanium nitride (Ti/TiN) composite layer.

5. The process of claim 1, wherein the step of forming the first glue layer includes depositing refractory metal.

6. The process of claim 1, wherein the step of forming the metallic layer includes depositing tungsten.

7. The process of claim 6, wherein the step of forming the second glue layer includes depositing titanium nitride (TiN).

8. The process of claim 7, wherein the polishing selectivity ratio between tungsten (W) and titanium nitride (TiN) is about 1:1.

9. The process of claim 1, wherein the step of forming the metallic layer includes depositing copper.

10. The process of claim 1, wherein the step of forming the second glue layer includes depositing refractory metal.

11. The process of claim 1, wherein the step of performing the polishing operation includes using a chemical-mechanical polishing method with slurry having the same polishing rate for both the metallic layer and the second glue layer.

12. A polishing process for tungsten, comprising the steps of:

providing a semiconductor substrate;

forming an insulating layer over the semiconductor substrate;

forming a trench within the insulating layer;

forming a first glue layer over surface of the trench;

after forming the first glue layer, performing photolithographic and etching operations to remove the first glue layer in a region surrounding the trench so that the insulating layer is exposed while the trench surface is still covered by the first glue layer;

after the first glue layer being etched, forming a second glue layer upon the remaining first glue layer and the exposed insulating layer;

forming a tungsten layer over the second glue layer so that the trench is completely filled, and the second glue layer and the tungsten layer have a polishing selectivity ratio of about 1:1; and performing a polishing operation to remove a portion of the tungsten layer and the second glue layer above the surface of the insulating layer uncovered by the first glue layer so that a metallic wiring layer is formed inside the trench.

13. The process of claim 12, wherein the step of forming the trench includes using photolithographic and anisotropic etching operations.

14. The process of claim 12, wherein the step of forming the first glue layer includes depositing titanium and then titanium nitride to form a titanium/titanium nitride (Ti/TiN) composite layer.

15. The process of claim 12, wherein the step of forming the first glue layer includes depositing titanium (Ti).

16. The process of claim 12, wherein the step of forming the first glue layer includes depositing refractory metal.

17. The process of claim 16, wherein the step of forming the second glue layer includes depositing titanium nitride (TiN).

18. The process of claim 17, wherein the polishing selectivity ratio between tungsten (W) and titanium nitride (TiN) is about 1:1.

19. The process of claim 12, wherein the step of performing the polishing operation includes using a chemical-mechanical polishing method with slurry having the same polishing rate for both the tungsten layer and the second glue layer.

20. A dual damascene manufacturing process, comprising the steps of:

providing a semiconductor substrate;

forming an insulating layer over the semiconductor substrate;

forming a trench and a via opening within the insulating layer, wherein the via opening is located below the trench;

forming a first glue layer including Titanium (Ti) over the surface of the trench and the via opening;

after forming the first glue layer, performing photolithographic and etching operations to remove a portion of the first glue layer surrounding the trench region so that the insulating layer is exposed while the trench and the via opening are still covered by the first glue layer;

after the first glue layer being etched, forming a titanium nitride layer upon the remaining first glue layer and the exposed insulating layer;

forming a metallic layer over the titanium nitride layer so that the trench and the via opening are completely filled, wherein the titanium nitride layer and the metallic layer have a polishing selectivity ratio of about 1:1; and performing a polishing operation to remove a portion of the metallic layer and titanium nitride layer above the surface of the insulating layer uncovered by the first glue layer so that a metallic wiring layer is formed inside the trench and a via is formed inside the via opening.

* * * * *